US012791613B1

(12) United States Patent
Verma et al.

(10) Patent No.: US 12,791,613 B1
(45) Date of Patent: Nov. 10, 2026

(54) SCAN-CHAIN HOLD FAILURE ROBUST TIME BORROWING MULTI BIT FLIP-FLOP DESIGN

(71) Applicant: SYNOPSYS, INC., Sunnyvale, CA (US)

(72) Inventors: Amit Verma, Hyderabad (IN); Sai Yaswanth Divvela, Hyderabad (IN); Basannagouda Somanath Reddy, San Jose, CA (US)

(73) Assignee: SYNOPSYS, INC., Sunnyvale, CA (US)

( * ) Notice: Subject to any disclaimer, the term of this patent is extended or adjusted under 35 U.S.C. 154(b) by 0 days.

(21) Appl. No.: 18/752,613

(22) Filed: Jun. 24, 2024

(51) Int. Cl.
*G01R 31/3185* (2006.01)
*G01R 31/317* (2006.01)

(52) U.S. Cl.
CPC ................ *G01R 31/318525* (2013.01); *G01R 31/31727* (2013.01); *G01R 31/318536* (2013.01)

(58) Field of Classification Search
CPC ...... G01R 31/318525; G01R 31/31727; G01R 31/318536
See application file for complete search history.

(56) References Cited

U.S. PATENT DOCUMENTS 7,146,549 B2 * 12/2006 Kanba .................. G11C 29/025 714/729
9,196,329 B1 * 11/2015 Yanni ..................... G11C 29/32
11,156,661 B2 * 10/2021 Cheng ................ G01R 31/3177
2016/0091566 A1 * 3/2016 Lu ................. G01R 31/318541 714/727

* cited by examiner

*Primary Examiner* — Regis J Betsch
*Assistant Examiner* — Amit R Bhatia
(74) *Attorney, Agent, or Firm* — WOMBLE BOND DICKINSON US LLP

(57) ABSTRACT

A multi bit flip-flop circuit includes a plurality of flip-flop circuits including a first flip-flop circuit and a second flip-flop circuit electrically coupled in series, each of the first flip-flop circuit and the second flip-flop circuit includes a primary latch that receives a first clock; and a secondary latch that is electrically coupled to the primary latch, wherein the secondary latch receives a second clock, in a first mode of operation, the first clock is substantially the same as the second clock, in a second mode of operation, the first clock is slower than the second clock.

20 Claims, 6 Drawing Sheets

SCAN-CHAIN HOLD FAILURE ROBUST TIME BORROWING MULTI BIT FLIP-FLOP DESIGN

TECHNICAL FIELD

The present disclosure relates to a multi bit flip-flop in an integrated circuit (IC). More specifically, the present disclosure relates to a scan-chain hold failure robust time borrowing multi bit flip-flop design.

BACKGROUND

A multi bit flip-flop has multiple one-bit flip-flops that are configured to be triggered from a clock signal provided from a single clock driver, where each of the one-bit flip-flops receives input data in parallel and outputs data in parallel. Sharing the clock driver from among multiple one-bit flip-flops can reduce the total clock dynamic power consumption, and reduce the total area contributed by the multiple flip-flops and the clock driver.

The above information in the Background section is only for enhancement of understanding of the background of the technology and therefore it should not be construed as admission of existence or relevancy of the prior art.

BRIEF DESCRIPTION OF THE DRAWINGS

The present disclosure will be understood more fully from the detailed description given below and from the accompanying figures of embodiments of the present disclosure. The figures are used to provide knowledge and understanding of embodiments of the present disclosure and do not limit the scope of the disclosure to these specific embodiments. Furthermore, the figures are not necessarily drawn to scale.

DETAILED DESCRIPTION

Figure 1A:
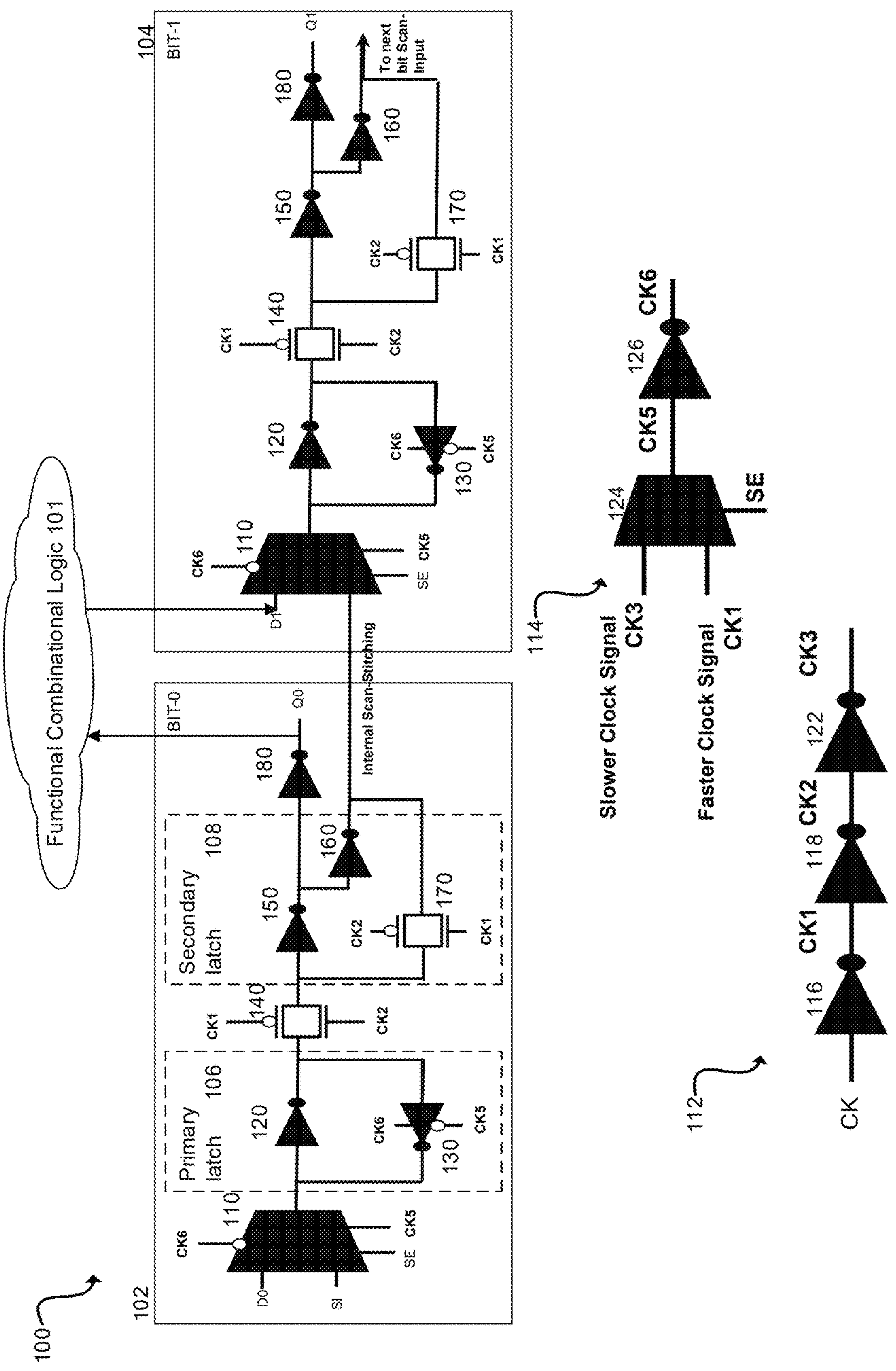
FIG. 1A is a circuit diagram of the present multi bit flip-flop, and a circuit diagram of a clock circuit and a circuit diagram of a signal generation logic circuit of the multi bit flip-flop, according to one or more embodiments of the present disclosure.

Aspects of the present disclosure relate to an scan-chain hold failure robust time borrowing multi bit flip-flop design.

Flip-flops may be triggered at the rising or falling edge of a clock signal, also referred to as the active edge for the flip-flop. If a flip-flop is triggered at a rising-edge of a clock signal, the flip-flop samples its input state only at the rising edge of the clock. On the other hand, if a flip-flop is triggered at a falling-edge of a clock signal, the flip-flop samples its input state only at the falling edge of the clock. Thereafter, the sampled value may be maintained in the flip-flop until the next rising or falling edge of the clock.

A flip-flop can successfully sample an input signal when setup time (Tsetup) and hold time requirements are met. For example, in an edge triggered flip-flop, setup time is the required amount of time during which the input data (to the flip-flop) must be stable before the next triggering-edge of the clock. If the data changes within the setup time window, metastability may occur and the input data may be lost and not stored in the flip-flop. On the other hand, for example, hold time is the required amount of time during which the input data must be stable after the triggering edge of the clock. Similar to setup time violation, hold time violation may cause data metastability and new data may not be correctly stored in the flip-flop.

In digital circuits with flip-flops, the clock frequency may be slowed down to accommodate delays in slow logic paths of the digital circuits. Because the flip-flops are edge triggered, if a faster logic path of the digital circuit produces a valid signal in less time than a slower logic path, that signal is not used until the rising or falling edge of the next clock pulse.

Time borrowing techniques may be used in digital circuits having flip-flops to address this issue, the digital circuit may be configured such that the flip-flops in the slower paths of the digital circuit have their clock edges delayed allowing time to be borrowed from fast logic paths and provided to slow logic paths, so that the clock speed for the entire circuit is not slowed down to accommodate worst-case delays.

For example, in a digital circuit with a pipeline of flip-flops, when applying time borrowing, a slow-path starting at a latch can borrow time from previous path in a pipeline. As a result, the two paths of the pipeline can meet the timing requirements, despite the slow second path because time is borrowed from the first path.

In digital circuits, the same sourced clock signal arrives at different components of the digital circuit at different times due to gate and wire signal propagation delay, and/or the like. In digital circuit, this phenomenon is called clock skew. For example, the difference in arrival times of clock signal at the respective clock pins of two different flip-flops in a digital circuit may be the clock skew between the two flip-flops.

In a time-borrowing flip-flop design, intentional skew may be introduced between clock signals driving primary and secondary latches to gain setup time without impacting the clock to Q delay of the flip-flops (e.g., Q is the output of a flip-flop). The clock to Q delay (Tck2$q$) in an edge triggered flip-flop specifies the amount of time after the active edge (the rising edge or the falling edge) of the clock that Q outputs the new value. Therefore, the introduction of intentional skew in the time-borrowing flip-flop design may improve the overall dead time (Tdead=Tsetup+Tck2$q$) of the digital circuit. As such, the overall dead time (Tdead) of a digital circuit may be a combination of the setup time (Tsetup) and the clock to Q delay (Tck2$q$). For example, dead time (Tdead) may be a duration of time during which a digital circuit remains idle. To improve the overall dead time (Tdead) using the time-borrowing concept, the clock signals from a first clock buffer are sent to the secondary latch and the clock signals from a second clock buffer are sent to the primary latch. The clock signals from the first clock buffer may be faster than the clock signals from the second clock buffer (e.g., the clock signal from the second clock buffer is a phase delayed version of the clock signal from the first clock buffer). This improves the dead time (Tdead) of the digital circuit by improving the setup time (e.g., by providing more time margin for the input signal to arrive at the input of the flip-flop) without impacting the clock to Q delay (e.g., because the output is still clocked by the clock signal from the first clock buffer).

A scan chain includes a series of flip-flops connected together to detect manufacturing defects in combinational logic of a circuit design. The scan chain performs as a shift register when the circuit design is in test timing mode (i.e., a scan enable signal to the flip-flops is active). During a scan mode of operation, the scan enable signal is asserted so each test vectors are loaded to the flip-flops, and each flip-flop receives a scan input. The combinational logic between the flip-flops are bypassed. The test patterns flow from one flip-flop to a subsequent flip-flop. In a scan mode of operation (e.g., a first mode of operation), the multiple bits of a multi-bit flip-flop are internally stitched together into a chain, such that a first flip-flop supplies its output to the next flip-flop in the chain and such that the multi-bit flip-flop operates like a shift register. This mode of operation is useful in, for example, debugging the operation of a circuit. However, during the scan mode of operation of a multi bit flip-flop, the introduction of intentional skew in clock signals between latches of adjacent bits may lead to scan-chain hold failures between the bits.

In a multi bit flip-flop (e.g., a time-borrowing multi bit flip-flop) with internally stitched scan-chains, several buffers may be added between the adjacent bits to avoid the scan-chain hold failures between the bits. For example, in an 8-bit flip-flop, 7 buffers may be added to avoid the scan-chain hold failures. However, adding buffers between the bits in a multi bit flip-flop may increase the area and power requirement of the circuit and does not provide appreciable improvement in the failure rate of the circuit. The addition of buffers between the bits in a multi bit flip-flop may be counterproductive to one goal of multi bit flip-flops to achieve reduced total dynamic power consumption and reduced total area compared to the equivalent single bit flip-flops.

One or more embodiments of the present disclosure provide a multi bit flip-flop where the clock signals are multiplexed (muxed) using a scan enable input as a select signal to switch the connections to either faster (e.g., earlier) clock signals for primary latches or slower (e.g., later or phase delayed) clock signals for secondary latches in the scan mode of operation. Technical advantages of the present disclosure include, but are not limited to, eliminating the clock skew and avoiding any scan-chain hold failures without compromising the performance of the multi bit flip-flop in terms of area and power consumption.

FIG. 1A is a circuit diagram of multi bit flip-flop 100, according to one or more embodiments of the present disclosure. In one or more embodiments, the multi bit flip-flop 100 may be a time-borrowing multi bit flip-flop. FIG. 1A also illustrates a circuit diagram of a clock circuit 112 and a circuit diagram of a signal generation logic circuit 114 of the multi bit flip-flop 100 of FIG. 1A, according to one or more embodiments of the present disclosure.

The multi bit flip-flop 100 includes a first flip-flop 102 (BIT-0) that outputs a first bit Q0 and a second flip-flop 104 (BIT-1) that outputs a second bit Q1. In one or more embodiments, the first flip-flop 102 and the second flip-flop 104 may be connected to a functional combinational logic cloud 101. Each of the first and second flip-flops 102 and 104 is a 1-bit flip-flop having a primary latch 106 and a secondary latch 108, and represents a bit slice of the multi bit flip-flop 100. The second flip-flop 104 may be identical in structure as the first flip-flop 102, and therefore overlapping descriptions will be omitted.

The first flip-flop 102 includes an input select circuit 110, a primary latch 106, a transfer circuit 140, a secondary latch 108, and an output driver or an output inverter 180.

The primary latch 106 includes two back to back inverters 120 and 130 connected at the output of the input select circuit 110. The input select circuit 110 may be configured to receive a data input (e.g., DO), a scan input SI connected to a previous flip-flop (if any) in the scan chain, a scan enable input SE to select between the data input and the scan input, and two clock input signals CK5 and CK6 (clock signals CK5 and CK6 may have different polarity).

The two back to back inverters 120 and 130 implement a bistable circuit that stores the output of the input select circuit 110 (the data input (e.g., DO) or the scan input SI based on the status of the scan enable signal SE) and are connected at the output of the input select circuit 110. In one or more embodiments, CK5 and CK6 are the control signals, and depending on the select enable SE and clock state (CK5=1,CK6=0) either DO or SI will be sampled or hold in the primary latch (e.g., the primary latch 106).

The input of the inverter 120 is connected to the output of the input select circuit 110 and the output of the inverter 130, and the output of the inverter 120 is electrically coupled to the input of the inverter 130 and the input of the secondary latch 108 through transfer circuit 140 The input of the inverter 130 is electrically coupled to the output of the inverter 120 and the input of the secondary latch 108 through transfer circuit 140 and the output of the inverter 130 is connected to the input of the inverter 120 and the output of the input select circuit 110. The inverter 130 may be configured to receive the two clock input signals CK5 and CK6.

The secondary latch 108 includes inverters 150 and 160, and a switching circuit 170. The transfer circuit 140 includes two transistors (a P-type transistor and an N-type transistor) connected together in parallel and configured to receive two clock input signals CK1 and CK2 at the gate electrodes of the transistors, such that the transfer circuit 140 transfers or passes the value output by the primary latch 106 to be stored in the secondary latch 108 in accordance with the two clock input signals CK1 and CK2. As shown in the clock circuit 112, second clock input signal CK2 is generated by supplying first clock input signal CK1 to an inverter 118. An input of the inverter 150 is connected to the output of the transfer circuit 140 and an output of the switching circuit 170, and an output of the inverter 150 is connected to the input of the inverter 160 and an input of the output inverter 180. An input of the inverter 160 is connected to the output of the inverter 150 and an output of the inverter 160 is directly connected to the scan input SI of the input select circuit 110 of the next stage of the multi bit flip-flop. For example, in the multi bit flip-flop 100, the output from the inverter 160 of the first flip-flop 102 (that outputs the first bit Q0) is directly connected to the scan input SI of the input select circuit 110 of the second flip-flop 104 (that outputs the second bit Q1). This arrangement is called internal scan stitching, such that, when the scan enable SE signal is active, the input select circuit 110 selects the value from the scan input SI as supplied by the previous flip flop, rather than the data input (D0/D1) for that bit of the multi bit flip-flop.

The switching circuit 170 of the secondary latch 108 includes two transistors (a P-type transistor and an N-type transistor) connected together in parallel and configured to receive two clock input signals CK1 and CK2 at the gate electrodes of the transistors. An input of the switching circuit 170 may be connected to the output of the inverter 160 and an output of the switching circuit 170 may be connected to the output of the transfer circuit 140 and the input of the inverter 150.

Because in the multi bit flip-flop 100 the scan-chains are internally stitched, the skew in the clock signals between the flip-flops (i.e., between the secondary latch of previous bit and primary latch of next bit) of the adjacent bits and the scan-chain hold failures between the consecutive bits of the multi bit flip-flop 100 may occur. To eliminate the clock skew and to avoid scan-chain hold failures, during the scan mode of operation of the multi bit flip-flop 100, clock signals are muxed using the scan enable input SE as a select signal in a way to change the clock signals supplied to the latches of the flip flop based on mode. In some embodiments, when operating in scan mode, faster clock signals are supplied to the primary latches, and in some embodiments, when operating in scan mode, slower clock signals are supplied to the secondary latches.

Because the clock connections remain unchanged during the normal mode of operation (e.g., a second mode of operation) of the multi bit flip-flop 100, embodiments of the present disclosure do not substantially impact the performance (e.g., area and power consumption) of the multi bit flip-flop 100. Further, during the scan mode of operation of the multi bit flip-flop 100, because any clock skew is eliminated by masking the clock signals, the multi bit flip-flop 100 may be robust against internal hold time failures. These features will be discussed in more detail with respect to FIGS. 1B-2B. For example, in one or more embodiments, the normal mode of operation (e.g., the second mode of operation) of the multi bit flip-flop 100 may refer to a capture mode, where SE is deserted, and flipflops work in a normal functional timing mode, and the test pattern response by the combinational logic is captured at the subsequent stage of the flip-flop.

Referring back to FIG. 1A, the clock circuit 112 includes three series connected inverters 116, 118, and 122 connected to each other. The inverter 116 may receive a clock signal CK as an input and outputs a first clock signal CK1 by inverting the clock signal CK, the inverter 118 may receive the clock signal CK1 as an input and outputs a second clock signal CK2 by inverting the first clock signal CK1, and the inverter 122 may receive the second clock signal CK2 as an input and outputs a third clock signal CK3 by inverting the second clock signal CK2. In this case the first clock signal CK1 may be faster than the second clock signal CK2, which may be faster than the third clock signal CK3 due to the delay.

Figure 1B:
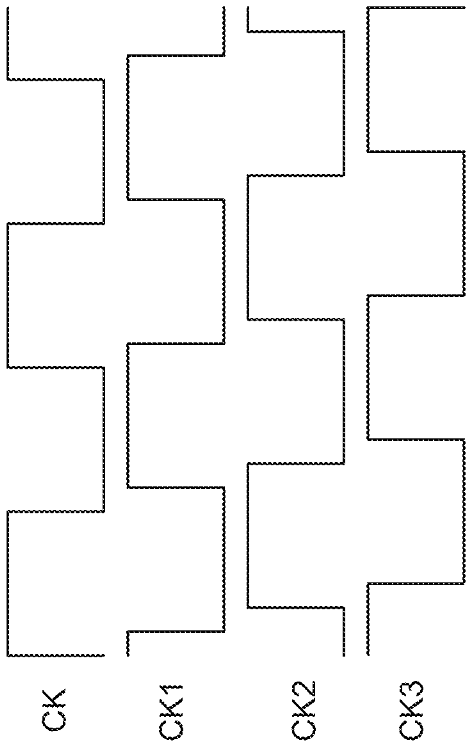
FIG. 1B illustrates waveforms of different clock signals, according to one or more embodiments of the present disclosure.

In addition, for example, as shown in FIG. 1B, the first clock signal CK1 has an inverted polarity compared to the clock signal CK, the second clock signal CK2 has an inverted polarity compared to the first clock signal CK1 (but has the same polarity as the clock signal CK), and the third clock signal CK3 has the same polarity as the first clock signal CK1, but where the third clock signal CK3 is slower (e.g., phase shifted to result in being phase delayed) compared to the first clock signal CK1. Also, as shown in FIG. 1B, the third clock signal CK3 is slower than the second clock signal CK2 (e.g., because of phase shift delay), which is slower than the first clock signal CK1 (e.g., because of phase shift delay).

Referring back to FIG. 1A, the signal generation logic circuit 114 may include an input select circuit 124 and an inverter 126. In one or more embodiments, the signal generation logic circuit 114 may be a part of the multi bit flip-flop 100. However, in one or more other embodiments, the signal generation logic circuit 114 may be external to the multi bit flip-flop 100 and coupled to the multi bit flip-flop 100. The input select circuit 124 of the signal generation logic circuit 114 may select between the first and third clock signals CK1 and CK3 based on the status of the scan enable input SE and outputs the selected clock signal CK1 or CK3 as an output clock signal CK5 of the input select circuit 124. The output of the input select circuit 124 is connected to an input of the inverter 126. The inverter 126 is configured to receive the clock signal CK5 as an input and outputs the clock signal CK6 by inverting the clock signal CK5.

In this case, the clock signal CK1 may be faster than CK3, as shown in the waveform diagrams of FIG. 1B. For example, because the input select circuit 124 uses the status of the scan enable input SE to select between the clock signals CK1 and CK3, when the scan enable input SE is equal to zero (e.g., during the normal mode of operation of the multi bit flip-flop 100) the output clock signal CK5 of the input select circuit 124 may be substantially equal to CK3 (a slower clock signal), adjusted by any delay introduced by the input select circuit 124. Therefore, during the normal mode of operation of the multi bit flip-flop 100, the primary latch 106, which is triggered by the clock signals CK5 and CK6 may be driven by the slower clock signals (e.g., when SE=0, CK5-CK3 and CK6=$\overline{\text{CK5}}$), and the secondary latch 108 which is triggered by the first and second clock signals CK1 and CK2 may be driven by the faster clock signals.

However, when the scan enable input SE is equal to one (e.g., during the scan mode of operation of the multi bit flip-flop 100) the output clock signal CK5 of the input select circuit 124 may be equal to CK1 (a faster clock signal). Therefore, during the scan mode of operation of the multi bit flip-flop 100, the primary latch 106, which is triggered by the clock signals CK5 and CK6 may be driven by the faster clock signals corresponding to first input clock signal CK1 and second input clock signal CK2 (e.g., when SE=1, CK5=CK1 and CK6=$\overline{\text{CK5}}$=CK2), and the secondary latch 108 which is triggered by the clock signals CK1 and CK2 may be also be driven by the faster clock signals. As such, because during the scan mode of operation, both the primary latch 106 and the secondary latch 108 are triggered by the faster clock signals CK1 and CK2, the clock skew between the two latches may be eliminated and a scan hold failure may be avoided.

Figure 2A:
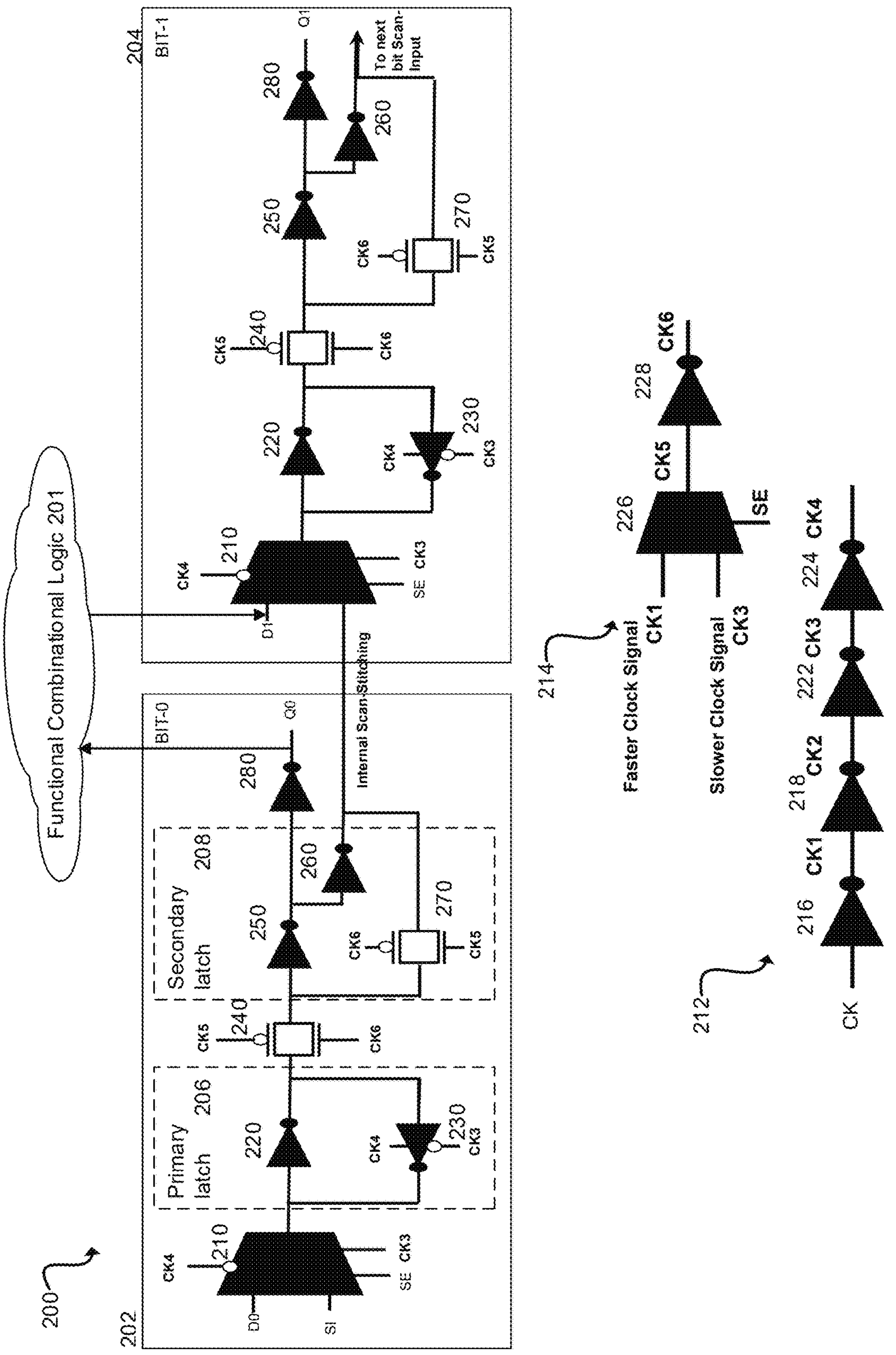
FIG. 2A represents another embodiment of the present multi bit flip-flop, a circuit diagram of a clock circuit and a circuit diagram of a signal generation logic circuit of the multi bit flip-flop, according to one or more embodiments of the present disclosure.

FIG. 2A represents another embodiment of the multi bit flip-flop of FIG. 1A, according to one or more embodiments of the present disclosure. FIG. 2A also illustrates a circuit diagram of a clock circuit 212 and a circuit diagram of a signal generation logic circuit 214 of the multi bit flip-flop 200 of FIG. 2A, according to one or more embodiments of the present disclosure. For example, in the multi bit flip-flop 200 of FIG. 2A, all the circuit components and their connectivity are the same as the multi bit flip-flop 100, however, different clock signals are used to trigger the primary latch 206 and the secondary latch 208. Therefore, overlapping descriptions will not be repeated.

In one or more embodiments, the multi bit flip-flop 200 may be a time-borrowing multi bit flip-flop. For example, the multi bit flip-flop 200 of FIG. 2A includes a first flip-flop 202 (BIT-0) that outputs a first bit Q0 and a second flip-flop 204 (BIT-1) that outputs a second bit Q1. In one or more embodiments, the first flip-flop 202 and the second flip-flop 204 may be connected to a functional combinational logic cloud 201. Each of the first and second flip-flops 202 and 204 is a 1-bit flip-flop having a primary latch and a secondary latch, and represents a bit slice of the multi bit flip-flop 200. The second flip-flop 204 may be identical in structure as the first flip-flop 202, and therefore overlapping descriptions will be omitted.

The first flip-flop 202 includes an input select circuit 210, a primary latch 206, a transfer circuit 240, a secondary latch 208, and an output driver or an output inverter 280.

The primary latch 206 includes two back to back inverters 220 and 230 connected at the output of the input select circuit 210. The input select circuit 210 may be configured to receive a data input (e.g., DO), a scan input SI connected to a previous flip-flop (if any) in the scan chain, a scan enable input SE to select between the data input and the scan input, and two clock input signals CK3 and CK4 (clock signals CK3 and CK4 may have different polarity). The two back to back inverters 220 and 230 implement a bistable circuit that stores the output of the input select circuit 210 (the data input (e.g., DO) or the scan input SI based on the status of the scan enable signal SE) and are connected at the output of the input select circuit 210.

The input of the inverter 220 is connected to the output of the input select circuit 210 and the output of the inverter 230, and the output of the inverter 220 is electrically coupled to the input of the inverter 230 and the input of the secondary latch 208 through transfer circuit 240 The input of the inverter 230 is electrically coupled to the output of the inverter 220 and the input of the secondary latch 208 through transfer circuit 240, and the output of the inverter 230 is connected to the input of the inverter 220 and the output of the input select circuit 210. The inverter 230 may be configured to receive the two clock input signals CK3 and CK4.

The secondary latch 208 includes inverters 250 and 260, and a switching circuit 270. The transfer circuit 240 includes two transistors (a P-type transistor and an N-type transistor) connected together in parallel and configured to receive two clock input signals CK5 and CK6 at the gate electrodes of the transistors, such that the transfer circuit 240 transfers or passes the value output by the primary latch 206 to be stored in the secondary latch 208 in accordance with the two clock input signals CK5 and CK6. An input of the inverter 250 is connected to the output of the transfer circuit 240 and an output of the switching circuit 270, and an output of the inverter 250 is connected to the input of the inverter 260 and an input of the output inverter 280. An input of the inverter 260 is connected to the output of the inverter 250 and an output of the inverter 260 is directly connected to the scan input SI of the input select circuit 210 of the next stage of the multi bit flip-flop. For example, in the multi bit flip-flop 200, the output from the inverter 260 of the first flip-flop 202 (that outputs the first bit Q0) is directly connected to the scan input SI of the input select circuit 210 of the second flip-flop 204 (that outputs the second bit Q1). This arrangement is called internal scan stitching, such that, when the scan enable SE signal is active, the input select circuit 210 selects the value from the scan input SI as supplied by the previous flip flop, rather than the data input for that bit of the multi bit flip-flop.

The switching circuit 270 of the secondary latch 208 includes two transistors (a P-type transistor and an N-type transistor) connected together in parallel and configured to receive two clock input signals CK5 and CK6 at the gate electrodes of the transistors. An input of the switching circuit 270 may be connected to the output of the inverter 260 and an output of the switching circuit 270 may be connected to the output of the transfer circuit 240 and the input of the inverter 250.

For example, unlike the multi bit flip-flop 100 where the input select circuit 110 and the inverter 130 receive the clock signals CK5 and CK6, in the multi bit flip-flop 200, the input select circuit 210 and the inverter 230 may receive the clock signals CK3 and CK4. Further, unlike the multi bit flip-flop 100 where the transfer circuit 140 and the switching circuit 170 receive the clock signals CK1 and CK2, in the multi bit flip-flop 200, the transfer circuit 240 and the switching circuit 270 may receive the clock signals CK5 and CK6. As such, unlike the multi bit flip-flop 100 where the primary latch 106 is triggered by the clock signals CK5 and CK6, and the secondary latch is triggered by the clock signals CK1 and CK2, in the multi bit flip-flop 200, the primary latch 206 is triggered by the clock signals CK3 and CK4, and the secondary latch is triggered by the clock signals CK5 and CK6.

The clock circuit 212 includes four series connected inverters 216, 218, 222, and 224 connected to each other. The inverter 216 may receive a clock signal CK as an input and outputs a clock signal CK1 by inverting the clock signal CK, the inverter 218 may receive the clock signal CK1 as an input and outputs a clock signal CK2 by inverting the clock signal CK1, the inverter 222 may receive the clock signal CK2 as an input and outputs a clock signal CK3 by inverting the clock signal CK2, and the inverter 224 may receive the clock signal CK3 as an input and outputs a clock signal CK4 by inverting the clock signal CK3. In this case the clock signal CK1 may be faster than the clock signal CK2, which may be faster than the clock signal CK3, which may be faster than the clock signal CK4.

Figure 2B:
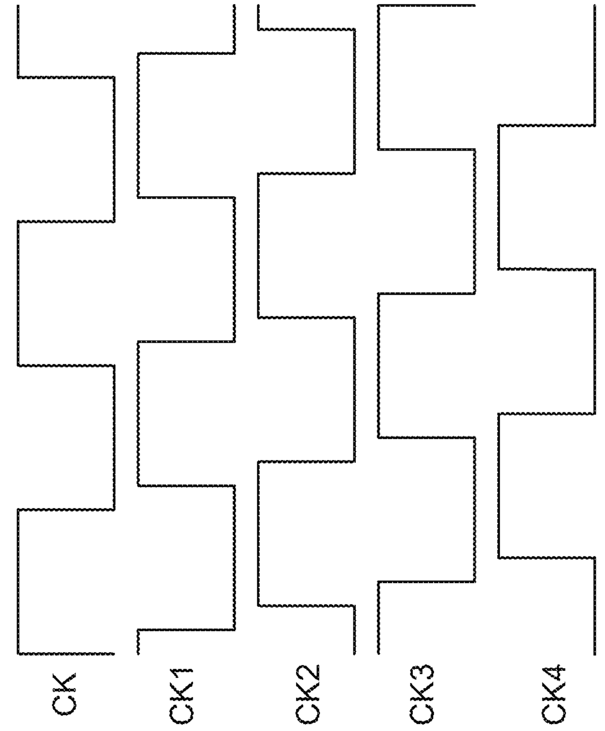
FIG. 2B illustrates waveforms of different clock signals, according to one or more embodiments of the present disclosure.

In addition, for example, as shown in FIG. 2B, the first clock signal CK1 has an inverted polarity compared to the clock signal CK, the second clock signal CK2 has an inverted polarity compared to the first clock signal CK1 (but has the same polarity as the clock signal CK), and the third clock signal CK3 has the same polarity as the first clock signal CK1, and the fourth clock signal CK4 has an inverted polarity compared to the third clock signal CK3 (but has the same polarity as the second clock signal CK2). The fourth clock signal CK4 is slower (e.g., phase shifted to result in being phase delayed) compared to the third clock signal CK3, the third clock signal CK3 is slower than the second clock signal CK2 (e.g., because of phase shift delay), which is slower than the first clock signal CK1 (e.g., because of phase shift delay).

The signal generation logic circuit 214 may include an input select circuit 226 and an inverter 228. In one or more embodiments, the signal generation logic circuit 214 may be a part of the multi bit flip-flop 200. However, in one or more other embodiments, the signal generation logic circuit 214 may be external to the multi bit flip-flop 200 and coupled to the multi bit flip-flop 200. The input select circuit 226 of the signal generation logic circuit 214 may select between the clock signals CK1 and CK3 based on the status of the scan enable input SE and outputs the selected clock signal CK1 or CK3 as an output clock signal CK5 of the input select circuit 226. The output of the input select circuit 226 is connected to an input of the inverter 228. The inverter 228 is configured to receive the clock signal CK5 as an input and outputs the clock signal CK6 by inverting the clock signal CK5.

In this case, the clock signal CK1 may be faster than CK3. For example, because the input select circuit 226 uses the status of the scan enable input SE to select between the clock signals CK1 and CK3, when the scan enable input SE is equal to zero (e.g., during the normal mode of operation of the multi bit flip-flop 200) the output clock signal CK5 of the input select circuit 226 may be equal to CK1 (a faster clock signal). Therefore, during the normal mode of operation of the multi bit flip-flop 200, the secondary latch 208, which is triggered by the clock signals CK5 and CK6 may be driven by the faster clock signals (e.g., when SE=0, CK5=CK1 and CK6=$\overline{\text{CK5}}$=CK2), and the primary latch 206 which is triggered by the clock signals CK3 and CK4 may be driven by the slower clock signals.

However, when the scan enable input SE is equal to one (e.g., during the scan mode of operation of the multi bit flip-flop 200) the output clock signal CK5 of the input select circuit 226 may be equal to CK3 (a slower clock signal). Therefore, during the scan mode of operation of the multi bit flip-flop 200, the secondary latch 208, which is triggered by the clock signals CK5 and CK6 may be driven by the slower clock signals CK3 and CK4 (e.g., when SE=1, CK5=CK3 and CK6=$\overline{\text{CK5}}$=CK4), and the primary latch 206 which is triggered by the clock signals CK3 and CK4 may be also be driven by the slower clock signals. As such, because during the scan mode of operation, both the primary latch 206 and the secondary latch 208 are triggered by the slower clock signals CK3 and CK4, the clock skew between the two latches may be eliminated and a scan hold failure may be avoided.

In some embodiments of the present disclosure, the time-borrowing multi-bit flip-flop of FIGS. 1A and 2A exhibits significant reduction in area & power without compromising on timing and at the same time have significant improvement in functional sigma compared to existing design solution/s.

Therefore, in one or more embodiments of the present disclosure, during the scan mode of operation of a multi bit flip-flop (where the scan-chains are internally stitched), clock signals are muxed using the scan enable input SE as a select signal in a way to switch the connections to either faster clock signals for primary latches or slower clock signals for secondary latches to eliminate the clock skew and avoid any scan-chain hold failures.

In one or more embodiments, a multi bit flip-flop circuit, includes: a plurality of flip-flop circuits including a first flip-flop circuit and a second flip-flop circuit electrically coupled in series, each of the first flip-flop circuit and the second flip-flop circuit includes: a primary latch that receives a first clock; and a secondary latch that is electrically coupled to the primary latch, wherein the secondary latch receives a second clock, wherein in a first mode of operation, the first clock is substantially the same as the second clock, wherein in a second mode of operation, the first clock is slower than the second clock.

In one or more embodiments, the primary latch further includes: a first inverter; and a second inverter, wherein the secondary latch includes a switching circuit connected between an input and an output of the secondary latch; wherein each of the first flip-flop circuit and the second flip-flop circuit further includes: a first input select circuit connected to an input of the primary latch; and a transfer circuit connected between an output of the primary latch and the input of the secondary latch, wherein an input of the first inverter is connected to an output of the first input select circuit and an output of the second inverter, and an output of the first inverter is connected to an input of the second inverter and the output of the primary latch, wherein the first input select circuit is connected to the output of the primary latch via the first inverter, and wherein an input of the second inverter is connected to the output of the first inverter and an output of the second inverter is connected to the input of the first inverter and the output of the first input select circuit.

In one or more embodiments, the secondary latch further includes: a third inverter; and a fourth inverter, wherein an input of the third inverter is connected to the output of the transfer circuit and the switching circuit, and an output of the third inverter is connected an input of the fourth inverter, and wherein the input of the fourth inverter is connected to the output of the third inverter and an output of the fourth inverter is connected to the output of the secondary latch that is connected to a next bit circuit from among the flip-flop circuits of the multi bit flip-flop circuit.

In one or more embodiments, the transfer circuit is connected between the output of the first inverter and the input of the third inverter, and wherein the switching circuit is connected between the input of the third inverter and the output of the fourth inverter.

In one or more embodiments, the multi bit flip-flop circuit further includes an output inverter, wherein an input of the output inverter is connected to the output of the third inverter, and configured to output a bit of the multi bit flip-flop circuit.

In one or more embodiments, the first flip-flop circuit or the second flip-flop circuit is configured to determine to operate in the first mode of operation or the second mode of operation based on a status of a scan enable signal received at the first input select circuit, and wherein the scan enable signal controls the first input select circuit to supply an output of a previous flip flop circuit among the plurality of flip-flop circuits of the multi bit flip-flop circuit to the input of the primary latch in the first mode of operation.

In one or more embodiments, the second clock includes a first clock signal and a second clock signal and the first clock includes a third clock signal and a fourth clock signal, wherein the multi bit flip-flop circuit further includes: a clock circuit configured to generate: the second clock signal by inverting the first clock signal, the third clock signal by inverting the second clock signal, and the fourth clock signal by inverting the third clock signal, and a signal generation logic circuit includes: a second input select circuit; and a fifth inverter connected to an output of the second input select circuit, wherein the second input select circuit is configured to output the first clock signal or the third clock signal based on a status of a select enable signal received at the second input select circuit, wherein the fifth inverter is configured to generate the second clock signal by inverting the first clock signal, and to generate the fourth clock signal by inverting the third clock signal, and wherein the first clock signal is faster than the second clock signal, the second clock signal is faster than the third clock signal, and the third clock signal is faster than the fourth clock signal.

In one or more embodiments, the first flip-flop circuit is configured to output a first bit of the multi bit flip-flop circuit and the second flip-flop circuit is configured to output a second bit of the multi bit flip-flop circuit, the second bit being a subsequent bit of the first bit.

In one or more embodiments, a method of operating a multi bit flip-flop circuit including a plurality of flip-flop circuits to generate a plurality of bits of the multi bit flip-flop circuit, the method includes: receiving, at a primary latch of a flip-flip circuit of the plurality of flip-flop circuits, a first clock; receiving, at a secondary latch of the flip-flip circuit, a second clock, the secondary latch being electrically coupled to the primary latch; and operating the flip-flop circuit, in a first mode or a second mode based on a scan enable signal received at the flip-flop circuit, wherein, in the first mode, the first clock is slower than the second clock, and wherein in the second mode, the first clock is substantially the same as the second clock.

In one or more embodiments, the second clock includes a first clock signal and a second clock signal and the first clock includes a third clock signal and a fourth clock signal.

In one or more embodiments, the method further includes: generating, by a clock circuit of the multi bit flip-flop circuit, the second clock signal by inverting the first clock signal, the third clock signal by inverting the second clock signal, and the fourth clock signal by inverting the third clock signal; and outputting, by a signal generation logic circuit of the multi bit flip-flop circuit, the first clock signal or the third clock signal based on a status of the scan enable signal received at the signal generation logic circuit; wherein the first clock signal and the second clock signal are faster than the third clock signal and the fourth clock signal.

In one or more embodiments, a non-transitory computer readable medium including stored instructions, which when executed by a processor, cause the processor to generate a digital representation of a circuit including a multi bit flip-flop circuit including a first flip-flop circuit, the first flip-flop circuit includes: a primary latch that receives a first clock; and a secondary latch that is electrically coupled to the primary latch, wherein the secondary latch receives a second clock, wherein in a first mode of operation, the first clock is substantially the same as the second clock, wherein in a second mode of operation, the first clock is slower than the second clock.

In one or more embodiments, the primary latch further includes: a first inverter; and a second inverter, wherein the secondary latch includes a switching circuit connected between an input and an output of the secondary latch; wherein the first flip-flop circuit further includes: a first input select circuit connected to an input of the primary latch; and a transfer circuit connected between an output of the primary latch and the input of the secondary latch, wherein an input of the first inverter is connected to an output of the first input select circuit and an output of the second inverter, and an output of the first inverter is connected an input of the second inverter and the output of the primary latch, wherein the first input select circuit is connected to the output of the primary latch via the first inverter, and wherein an input of the second inverter is connected to the output of the first inverter and an output of the second inverter is connected to the input of the first inverter and the output of the first input select circuit.

In one or more embodiments, the secondary latch further includes: a third inverter; and a fourth inverter, wherein an input of the third inverter is connected to the output of the transfer circuit and the switching circuit, and an output of the third inverter is connected an input of the fourth inverter, and wherein the input of the fourth inverter is connected to the output of the third inverter and an output of the fourth inverter is connected to the output of the secondary latch that is connected to a next bit circuit from among the flip-flop circuits of the multi bit flip-flop circuit.

In one or more embodiments, the transfer circuit is connected between the output of the first inverter and the input of the third inverter, and wherein the switching circuit is connected between the input of the third inverter and the output of the fourth inverter.

In one or more embodiments, the non-transitory computer readable medium further includes an output inverter, wherein an input of the output inverter is connected to the output of the third inverter, and configured to output a bit of the multi bit flip-flop circuit.

In one or more embodiments, the first flip-flop circuit is configured to determine to operate in the first mode of operation or the second mode of operation based on a status of a scan enable signal received at the first input select circuit, and wherein the scan enable signal controls the first input select circuit to supply an output of a previous flip flop circuit of the multi bit flip-flop circuit to the input of the primary latch in the first mode of operation.

In one or more embodiments, the second clock includes a first clock signal and a second clock signal and the first clock includes a third clock signal and a fourth clock signal, wherein the multi bit flip-flop circuit further includes: a clock circuit configured to generate: the second clock signal by inverting the first clock signal, the third clock signal by inverting the second clock signal, and the fourth clock signal by inverting the third clock signal, and a signal generation logic circuit includes: a second input select circuit; and a fifth inverter connected to an output of the second input select circuit, wherein the second input select circuit is configured to output the first clock signal or the third clock signal based on a status of a select enable signal received at the second input select circuit, and wherein the fifth inverter is configured to generate the second clock signal by inverting the first clock signal, and to generate the fourth clock signal by inverting the third clock signal.

In one or more embodiments, the first clock signal is faster than the second clock signal, the second clock signal is faster than the third clock signal, and the third clock signal is faster than the fourth clock signal.

In one or more embodiments, the first flip-flop circuit is configured to output a first bit of the multi bit flip-flop circuit.

Figure 3:
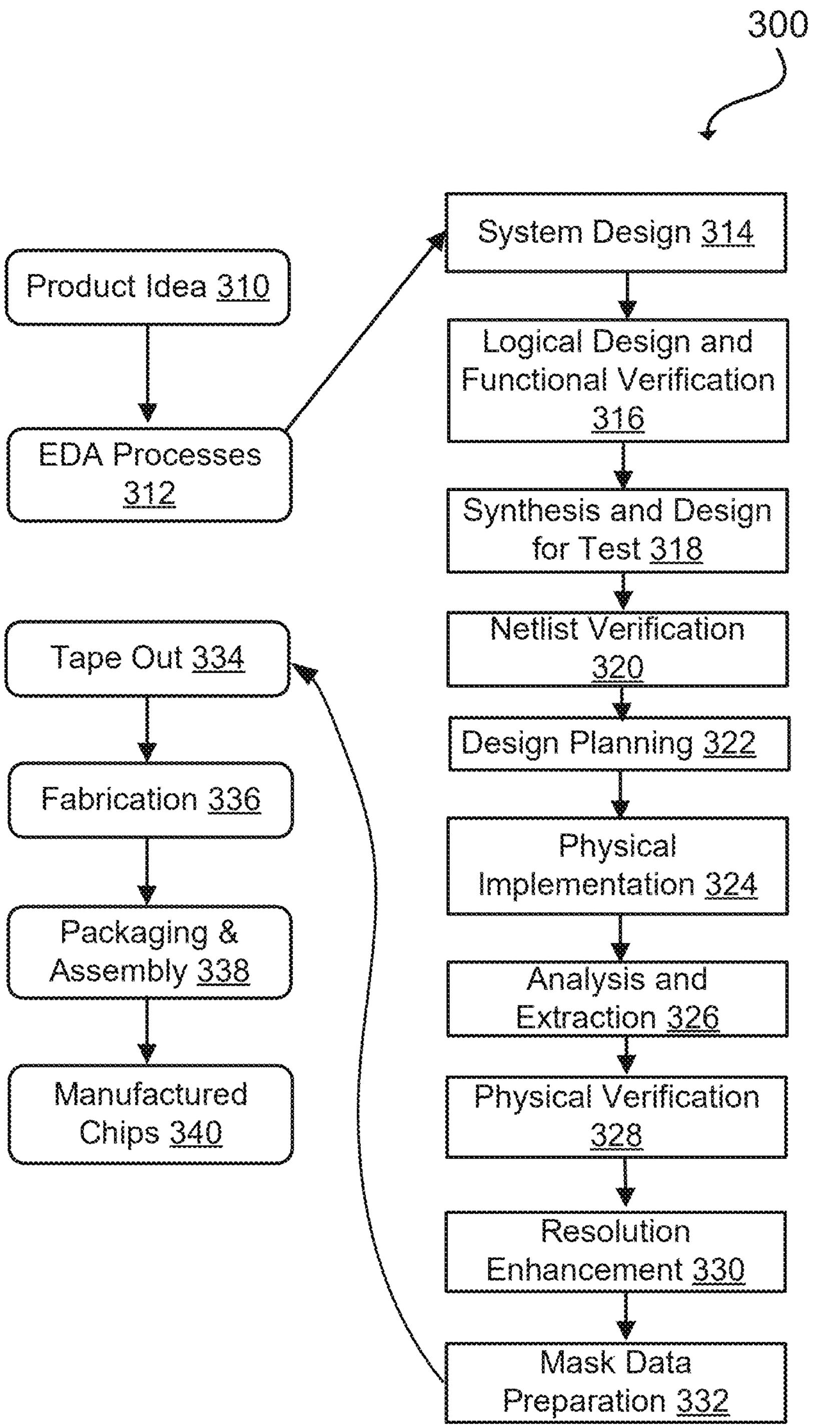
FIG. 3 depicts a flowchart of various processes used during the design and manufacture of an integrated circuit in accordance with some embodiments of the present disclosure.

FIG. 3 illustrates an example set of processes 300 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 310 with information supplied by a designer, information which is transformed to create an article of manufacture that uses a set of EDA processes 312. When the design is finalized, the design is taped-out 334, which is when artwork (e.g., geometric patterns) for the integrated circuit is sent to a fabrication facility to manufacture the mask set, which is then used to manufacture the integrated circuit. After tape-out, a semiconductor die is fabricated 336 and packaging and assembly processes 338 are performed to produce the finished integrated circuit 340.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or Open Vera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 3. The processes described by be enabled by EDA products (or EDA systems).

During system design 314, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 316, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 318, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 320, the netlist is checked for compliance with timing constraints and for correspondence with the HDL code. During design planning 322, an overall floor plan for the integrated circuit is constructed and analyzed for timing and top-level routing.

During layout or physical implementation 324, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 326, the circuit function is verified at the layout level, which permits refinement of the layout design. During physical verification 328, the layout design is checked to ensure that manufacturing constraints are correct, such as DRC constraints, electrical constraints, lithographic constraints, and that circuitry function matches the HDL design specification. During resolution enhancement 330, the geometry of the layout is transformed to improve how the circuit design is manufactured.

During tape-out, data is created to be used (after lithographic enhancements are applied if appropriate) for production of lithography masks. During mask data preparation 332, the 'tape-out' data is used to produce lithography masks that are used to produce finished integrated circuits.

A storage subsystem of a computer system (such as computer system 400 of FIG. 4) may be used to store the programs and data structures that are used by some or all of the EDA products described herein, and products used for development of cells for the library and for physical and logical design that use the library.

Figure 4:
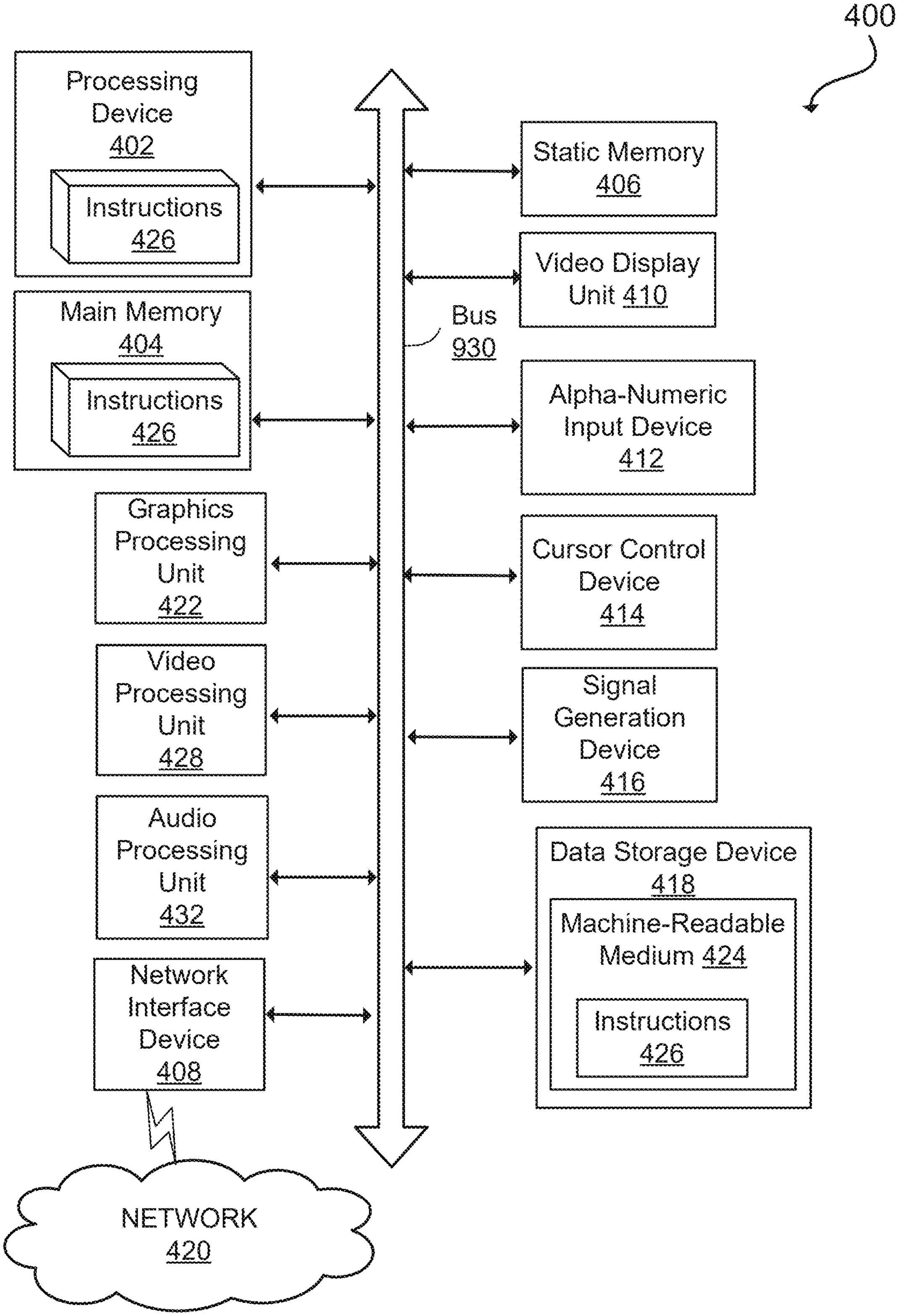
FIG. 4 depicts a diagram of an example computer system in which embodiments of the present disclosure may operate.

FIG. 4 illustrates an example machine of a computer system 400 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM), a static memory 406 (e.g., flash memory, static random access memory (SRAM), etc.), and a data storage device 418, which communicate with each other via a bus 430.

Processing device 402 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 may also be one or more special-purpose processing devices such as an application specific integrated circuit (ASIC), a field programmable gate array (FPGA), a digital signal processor (DSP), network processor, or the like. The processing device 402 may be configured to execute instructions 426 for performing the operations and steps described herein.

The computer system 400 may further include a network interface device 408 to communicate over the network 420. The computer system 400 also may include a video display unit 410 (e.g., a liquid crystal display (LCD) or a cathode ray tube (CRT)), an alphanumeric input device 412 (e.g., a keyboard), a cursor control device 414 (e.g., a mouse), a graphics processing unit 422, a signal generation device 416 (e.g., a speaker), graphics processing unit 422, video processing unit 428, and audio processing unit 432.

The data storage device 418 may include a machine-readable storage medium 424 (also known as a non-transitory computer-readable medium) on which is stored one or more sets of instructions 426 or software embodying any one or more of the methodologies or functions described herein. The instructions 426 may also reside, completely or at least partially, within the main memory 404 and/or within the processing device 402 during execution thereof by the computer system 400, the main memory 404 and the processing device 402 also constituting machine-readable storage media.

In some implementations, the instructions 426 include instructions to implement functionality corresponding to the present disclosure. While the machine-readable storage medium 424 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A multi bit flip-flop circuit, comprising:

a plurality of flip-flop circuits comprising a first flip-flop circuit and a second flip-flop circuit electrically coupled in series, each of the first flip-flop circuit and the second flip-flop circuit comprising:

a primary latch comprising a first inverter and a second inverter that directly receives a first clock, an output of the first inverter being directly connected to an input of the second inverter and an output of the second inverter being directly connected to an input of the first inverter; and a secondary latch that is electrically coupled to the primary latch, wherein the secondary latch receives a second clock, wherein in a first mode of operation, the first clock is substantially the same as the second clock, wherein in a second mode of operation, the first clock is slower than the second clock.

2. The multi bit flip-flop circuit of claim 1, wherein the secondary latch comprises a switching circuit connected between an input and an output of the secondary latch;

wherein each of the first flip-flop circuit and the second flip-flop circuit further comprises:

a first input select circuit connected to an input of the primary latch; and a transfer circuit connected between an output of the primary latch and the input of the secondary latch, wherein the input of the first inverter is connected to an output of the first input select circuit and the output of the second inverter, and the output of the first inverter is connected to the input of the second inverter and the output of the primary latch, wherein the first input select circuit is connected to the output of the primary latch via the first inverter, and wherein the input of the second inverter is connected to the output of the first inverter, and the output of the second inverter is connected to the input of the first inverter and the output of the first input select circuit.

3. The multi bit flip-flop circuit of claim 2, wherein the secondary latch further comprises:

a third inverter; and a fourth inverter, wherein an input of the third inverter is connected to the output of the transfer circuit and the switching circuit, and an output of the third inverter is connected an input of the fourth inverter, and wherein the input of the fourth inverter is connected to the output of the third inverter, and an output of the fourth inverter is connected to the output of the secondary latch that is connected to a next bit circuit from among the flip-flop circuits of the multi bit flip-flop circuit.

4. The multi bit flip-flop circuit of claim 3, wherein the transfer circuit is connected between the output of the first inverter and the input of the third inverter, and wherein the switching circuit is connected between the input of the third inverter and the output of the fourth inverter.

5. The multi bit flip-flop circuit of claim 3, further comprising an output inverter, wherein an input of the output inverter is connected to the output of the third inverter and configured to output a bit of the multi bit flip-flop circuit.

6. The multi bit flip-flop circuit of claim 2, wherein the first flip-flop circuit or the second flip-flop circuit is configured to operate in the first mode of operation or the second mode of operation based on a status of a scan enable signal received at the first input select circuit, and wherein the scan enable signal controls the first input select circuit to supply an output of another flip flop circuit among the plurality of flip-flop circuits of the multi bit flip-flop circuit to the input of the primary latch in the first mode of operation.

7. The multi bit flip-flop circuit of claim 2, wherein the second clock comprises a first clock signal, and a second clock signal and the first clock comprises a third clock signal and a fourth clock signal, wherein the multi bit flip-flop circuit further comprises:

a clock circuit configured to generate: the second clock signal by inverting the first clock signal, the third clock signal by inverting the second clock signal, and the fourth clock signal by inverting the third clock signal, and a signal generation logic circuit comprising:

a second input select circuit; and a third inverter connected to an output of the second input select circuit, wherein the second input select circuit is configured to output the first clock signal or the third clock signal based on a status of a select enable signal received at the second input select circuit, wherein the third inverter is configured to generate the second clock signal by inverting the first clock signal, and to generate the fourth clock signal by inverting the third clock signal, and wherein the first clock signal is faster than the second clock signal, the second clock signal is faster than the third clock signal, and the third clock signal is faster than the fourth clock signal.

8. The multi bit flip-flop circuit of claim 1, wherein the first flip-flop circuit is configured to output a first bit of the multi bit flip-flop circuit, and the second flip-flop circuit is configured to output a second bit of the multi bit flip-flop circuit, the second bit being a subsequent bit of the first bit.

9. A method of operating a multi bit flip-flop circuit comprising a plurality of flip-flop circuits to generate a plurality of bits of the multi bit flip-flop circuit, the method comprising:

receiving, at a primary latch of a flip-flip circuit of the plurality of flip-flop circuits, a first clock;

receiving, at a secondary latch of the flip-flip circuit, a second clock, the secondary latch being electrically coupled to the primary latch; and operating the flip-flop circuit, in a first mode or a second mode based on a scan enable signal received at the flip-flop circuit, wherein the primary latch comprises a first inverter and a second inverter that directly receives the first clock, an output of the first inverter being directly connected to an input of the second inverter and an output of the second inverter being directly connected to an input of the first inverter, wherein, in the first mode, the first clock is slower than the second clock, and wherein in the second mode, the first clock is substantially the same as the second clock.

10. The method of claim 9, wherein the second clock comprises a first clock signal, and a second clock signal and the first clock comprises a third clock signal and a fourth clock signal.

11. The method of claim 10, further comprising:

generating, by a clock circuit of the multi bit flip-flop circuit, the second clock signal by inverting the first clock signal, the third clock signal by inverting the second clock signal, and the fourth clock signal by inverting the third clock signal; and outputting, by a signal generation logic circuit of the multi bit flip-flop circuit, the first clock signal or the third clock signal based on a status of the scan enable signal received at the signal generation logic circuit, wherein the first clock signal and the second clock signal are faster than the third clock signal and the fourth clock signal.

12. A non-transitory computer readable medium comprising stored instructions, which when executed by a processor, cause the processor to generate a digital representation of a circuit comprising a multi bit flip-flop circuit comprising a first flip-flop circuit, the first flip-flop circuit comprising:

a primary latch comprising a first inverter and a second inverter that directly receives a first clock, an output of the first inverter being directly connected to an input of the second inverter and an output of the second inverter being directly connected to an input of the first inverter; and a secondary latch that is electrically coupled to the primary latch, wherein the secondary latch receives a second clock, wherein in a first mode of operation, the first clock is substantially the same as the second clock, wherein in a second mode of operation, the first clock is slower than the second clock.

13. The non-transitory computer readable medium of claim 12, wherein the secondary latch comprises a switching circuit connected between an input and an output of the secondary latch;

wherein the first flip-flop circuit further comprises:

a first input select circuit connected to an input of the primary latch; and a transfer circuit connected between an output of the primary latch and the input of the secondary latch, wherein the input of the first inverter is connected to an output of the first input select circuit and the output of the second inverter, and the output of the first inverter is connected to the input of the second inverter and the output of the primary latch, wherein the first input select circuit is connected to the output of the primary latch via the first inverter, and wherein the input of the second inverter is connected to the output of the first inverter, and the output of the second inverter is connected to the input of the first inverter and the output of the first input select circuit.

14. The non-transitory computer readable medium of claim 13, wherein the secondary latch further comprises:

a third inverter; and a fourth inverter, wherein an input of the third inverter is connected to the output of the transfer circuit and the switching circuit, and an output of the third inverter is connected an input of the fourth inverter, and wherein the input of the fourth inverter is connected to the output of the third inverter and an output of the fourth inverter is connected to the output of the secondary latch that is connected to a next bit circuit from among the flip-flop circuits of the multi bit flip-flop circuit.

15. The non-transitory computer readable medium of claim 14, wherein the transfer circuit is connected between the output of the first inverter and the input of the third inverter, and wherein the switching circuit is connected between the input of the third inverter and the output of the fourth inverter.

16. The non-transitory computer readable medium of claim 14, the multi bit flip-flop circuit further comprising an output inverter, wherein an input of the output inverter is connected to the output of the third inverter and configured to output a bit of the multi bit flip-flop circuit.

17. The non-transitory computer readable medium of claim 13, wherein the first flip-flop circuit is configured to operate in the first mode of operation or the second mode of operation based on a status of a scan enable signal received at the first input select circuit, and wherein the scan enable signal controls the first input select circuit to supply an output of another flip flop circuit of the multi bit flip-flop circuit to the input of the primary latch in the first mode of operation.

18. The non-transitory computer readable medium of claim 13, wherein the second clock comprises a first clock signal and a second clock signal and the first clock comprises a third clock signal and a fourth clock signal, wherein the multi bit flip-flop circuit further comprises:

a clock circuit configured to generate: the second clock signal by inverting the first clock signal, the third clock signal by inverting the second clock signal, and the fourth clock signal by inverting the third clock signal, and a signal generation logic circuit comprising:

a second input select circuit; and a third inverter connected to an output of the second input select circuit, wherein the second input select circuit is configured to output the first clock signal or the third clock signal based on a status of a select enable signal received at the second input select circuit, and wherein the third inverter is configured to generate the second clock signal by inverting the first clock signal, and to generate the fourth clock signal by inverting the third clock signal.

19. The non-transitory computer readable medium of claim 18, wherein the first clock signal is faster than the second clock signal, the second clock signal is faster than the third clock signal, and the third clock signal is faster than the fourth clock signal.

20. The non-transitory computer readable medium of claim 12, wherein the first flip-flop circuit is configured to output a first bit of the multi bit flip-flop circuit.

* * * * *